United States Patent
Ikeda

(10) Patent No.: US 6,476,416 B1
(45) Date of Patent: Nov. 5, 2002

(54) THIN-FILM SEMICONDUCTOR APPARATUS, DISPLAY APPARATUS USING SUCH SEMICONDUCTOR APPARATUS, AND METHOD OF MANUFACTURING SUCH DISPLAY APPARATUS

(75) Inventor: Hiroyuki Ikeda, Kanagawa (JP)

(73) Assignee: Sony Corporation (JP)

( * ) Notice: Subject to any disclaimer, the term of this patent is extended or adjusted under 35 U.S.C. 154(b) by 15 days.

(21) Appl. No.: 09/735,937

(22) Filed: Dec. 14, 2000

(30) Foreign Application Priority Data

Dec. 20, 1999 (JP) .......................................... 11-361186

(51) Int. Cl.$^7$ .............................................. H01L 33/00
(52) U.S. Cl. .......................................... 257/59; 257/57
(58) Field of Search ...................... 257/59, 57

(56) References Cited

U.S. PATENT DOCUMENTS

| | | | | |
|---|---|---|---|---|
| 5,525,813 | A | * | 6/1996 | Miyake et al. |
| 6,016,174 | A | * | 1/2000 | Endo et al. |
| 6,133,968 | A1 | * | 10/2001 | Asada |
| 6,320,221 | B1 | * | 11/2001 | Choi et al. |
| 6,392,255 | B1 | * | 5/2002 | Shibata et al. |

FOREIGN PATENT DOCUMENTS

| | | |
|---|---|---|
| EP | 0063026 | 10/1982 |
| JP | 07154288 | 6/1995 |
| JP | 08044832 | 2/1996 |
| JP | 09044615 | 2/1997 |
| JP | 11238148 | 8/1999 |
| JP | 11282978 | 10/1999 |
| JP | 11308146 | 11/1999 |

* cited by examiner

Primary Examiner—Stephen D. Meier
(74) Attorney, Agent, or Firm—Rader, Fishman & Grauer PLLC; Ronald P. Kananen

(57) ABSTRACT

The invention provides a thin-film semiconductor apparatus which is capable of preventing wiring formed in the thin-film semiconductor apparatus from incurring inter-layer short-circuit otherwise caused by improper step coverage of a gate insulating film, and yet, the thin-film semiconductor apparatus is also capable of lowering electric resistance. More particularly, the thin-film semiconductor apparatus comprises a plurality of bottom-gate-type thin-film transistors which are integrally formed on an insulating substrate, wherein each of the thin-film transistors comprises a lower gate wiring 2 formed on the substrate, a gate electrode 5 to be set to the same potential with that of said lower-side wiring 2 and patterned simultaneously with patterning of said lower-side wiring 2, an insulating film formed on the gate wiring 2 and the gate electrode 5, a semiconductor thin-film 4 formed on the insulating film as to make a device area of each of the thin-film transistors, an inter-layer film formed on the semiconductor thin film 4, and an upper signal wiring 3 being connected to each of the thin-film transistors via contact holes formed on the inter-layer film. The gate wiring 2 has such a thickness being thicker than the gate electrode 5 and keeps electric resistance to a lower value. Further, the gate wiring 2 comprises a stepped form that covers a surface layer SL or an inner layer IL, whereby reducing stepwise difference that normally causes inter-layer short-circuit to occur as a result of improper step-coverage of the gate insulating film.

37 Claims, 5 Drawing Sheets

THIN-FILM SEMICONDUCTOR APPARATUS, DISPLAY APPARATUS USING SUCH SEMICONDUCTOR APPARATUS, AND METHOD OF MANUFACTURING SUCH DISPLAY APPARATUS

BACKGROUND OF THE INVENTION

1. Field of the Invention

The present invention relates to a thin-film semiconductor apparatus, a display apparatus using such thin-film semiconductor apparatus, and a method of manufacturing such display apparatus. More particularly, the invention relates to a construction of a gate electrode and a gate wiring of bottom-gate-type thin-film transistors integrally formed as the thin-film semiconductor apparatus. This invention further relates to a display apparatus which employs thus constructed thin-film semiconductor apparatus, and this invention relates to a method of manufacturing a display apparatus employing thus constructed thin-film semiconductor apparatus.

2. Description of the Related Art

A thin-film semiconductor apparatus comprising a number of integrally formed bottom-gate-type thin-film transistors and a display apparatus using such bottom-gate-type thin-film transistors are respectively disclosed in the Japanese Laid-Open Patent Publication No. HEISEI-11-153808/1999, the Japanese Laid-Open Patent Publication No. HEISEI-11-258633/1999, and the Japanese Laid-Open Patent Publication No. HEISEI-11-259016/1999, for example.

Generally, the thin-film semiconductor apparatus such as disclosed in the above identified publications comprises a lower-side wiring having a gate wiring and an auxiliary capacitor wiring formed on an insulating substrate, a gate electrode to be set to the same potential with the lower-side wiring and being patterned simultaneously with the lower-side wiring, a gate insulating film formed on the lower-side wiring and the gate electrode, a semiconductor thin-film formed on the gate insulating film to make a device area of the thin-film transistor TFT, an inter-layer insulating film formed on the semiconductor thin-film, and upper-side wiring having signal wiring which is formed on the inter-layer insulating film and being connected to the thin-film transistor TFT via contact holes.

Structurally, the conventional bottom-gate-type thin-film transistors are composed of a plurality of semiconductor thin-films laminated on a gate electrode via a gate insulating film. The semiconductor thin film is made of polycrystalline silicon crystallized via a laser-beam irradiation process. Inasmuch as the so-called "a laser-annealing process" can produce polycrystalline silicon containing satisfactory characteristics via a relatively low temperature, the laser-annealing process itself has become an important processing technique for producing polycrystalline silicon thin-film transistors at a relatively low temperature. However, when a substrate is irradiated with a laser beam, the substrate is momentarily heated to such a high temperature beyond 1000° C., and thus, the gate electrode and the gate wiring have to be composed of heat-resistive metal having a high melting temperature. On the other hand, when utilizing such heat-resistive metal, increasing electric resistance of the gate wiring becomes critical problem with reference to a enlarged monitor screen size and finer resolution capability of display devices. As the electric resistance becomes larger, a time constant of the gate wiring also becomes large, thereby gate pulses are delayed due to the enlarged time constant. This delay in turn causes shading on both sides of a displayed image on the monitor screen to degrade display characteristics. To cope with this, specific metal material with lower electric resistance is preferably utilized for the gate wiring. Nevertheless, along with further expansion of the monitor screen size, in order to reduce the electric resistance, it is essential that film thickness of the gate wiring has to be increased.

On the other hand, from the standpoint of production technology, it is known that the thicker the film thickness of the gate wiring is, the worse the step-coverage of the gate insulating film becomes, and this causes inter-layer short-circuit. Concretely, when the film thickness of the gate wiring becomes large, it causes a significant stepwise difference to be generated on the surface of the insulating substrate. Such significant stepwise difference can hardly be leveled off by means of a thin gate insulating film. Once the semiconductor thin film and the signal wiring are formed on the surface of the insulating substrate bearing substantial stepwise difference, short-circuit failure occurs between the lower-side wiring and the upper-side wiring at the portion where the step-coverage is not fully secured. The inter-layer short-circuit has long been a critical problem in order to achieve mass production of large-sized display apparatus having satisfactory quality.

According to the conventional production technology, it was quite difficult to bilaterally satisfy the need for reducing the electric resistance of the gate wiring relative to the expansion of the monitor screen size and the need for reducing the thickness of the gate wiring film being essential for promoting the production yield.

Generally, the gate electrode is composed of layered material identical to the gate wiring and the auxiliary capacitor wiring. When the thickness of the gate wiring is increased, the thickness of the gate electrode is inevitably increased. Increased film thickness of the gate electrode gravely affects crystallization of the semiconductor thin-film by means of the laser-annealing process. When the film thickness of the gate electrode increases, in terms of thermodynamics, a thermal capacity of the metal to act as a thermal absorptive portion against silicon layers increases during the laser-beam irradiation process to make it difficult to efficiently heat up the silicon layer. When excess energy is fed to the silicon layer in order to compensate for the amount of heat released from the silicon layer, it in turn causes defect in the crystallized silicon thin film, thus also raising a problem.

SUMMARY OF THE INVENTION

In order to fully solve the above problems, the invention presents a first means by way of the following. Concretely, the invention provides a novel thin-film semiconductor apparatus comprising a plurality of thin-film transistors integrally formed on an insulating substrate. The novel thin-film semiconductor apparatus characteristically comprises lower-side wiring formed on the insulating substrate, a gate electrode to be set to the same potential with the lower-side wiring and being patterned simultaneously with the lower-side wiring, an insulating film formed over the lower-side wiring and the gate electrode, a semiconductor thin film formed on the insulating film to make a device area of the thin-film transistor, an inter-layer film formed on the semiconductor thin-film, and an upper-side wiring formed on the inter-layer film and being connected to the thin-film transistors via contact holes. Characteristically, the gate electrode has such a thickness being less than that of the lower-side wiring.

Concretely, the above-referred gate electrode and the lower-side wiring are respectively composed of a layered structure. The number of layers for composing the gate electrode is less than the number of layers for composing the lower-side wiring. More concretely, the gate electrode is composed of a single layered structure solely consisting of a surface layer, whereas the lower-side wiring is composed of multi-layered structure comprising an inner layer being formed below the surface layer. In this case, each of the inner layers is made from a metal having lower electric resistance value than that of the surface layer, whereas the surface layer is made from such metal having higher melting temperature than that of the inner layer. For example, each of the inner layer is made from aluminum-based metal. The surface layer is made from any metal selected from molybdenum, tantalum, tungsten, or chromium. Preferably, the semiconductor thin-film comprises polycrystalline silicon crystallized by a laserbeam irradiation process.

Further, in order to more fully solve the above-referred problems, the invention presents a second means. Concretely, the invention further provides a novel thin-film semiconductor apparatus comprising a plurality of thin-film transistors integrally formed on an insulating substrate. The novel thin-film semiconductor apparatus characteristically comprises a lower-side wiring formed on an insulating substrate, a gate electrode connected to the lower-side wiring, an insulating film formed on the lower-side wiring and the gate electrode, a semiconductor thin-film formed on the insulating film to form a device area of the thin-film transistor, an inter-layer film formed on the semiconductor thin-film, and an upper-side wiring formed on the inter-layer film and connected to the thin-film transistors via contact holes.

The above-referred lower-side wiring comprises a multi-layered structure in which at least a second wiring layer is superposed on a first wiring layer. Further, width of the second wiring layer is arranged to be greater than the width of the first wiring layer to enable the second wiring layer to fully cover the first wiring layer. Further a size from an end of the first wiring layer to an end of the second wiring layer projecting to the outer portion in the width direction is arranged to be greater than the thickness of the second wiring layer.

Preferably, the first wiring layer is made from a metal having a lower electric resistance than that of the second wiring layer and the second wiring layer is made from a metal having higher melting temperature than that of the first wiring metal. For example, the first wiring layer is composed of aluminum-based metal, whereas the second wiring layer is composed of any metal selected from molybdenum, tantalum, tungsten, or chromium. In actual forms for carrying out the invention, the above-referred first wiring layer comprises multi-layered structure in which at least the second wiring layer is superposed on the first wiring layer, whereas the above-referred gate electrode comprises a single-layer solely comprising the second wiring layer. The above-referred semiconductor thin film comprises polycrystalline silicon crystallized by the laser-beam irradiation process.

According to the first means of the invention, thickness of the gate electrode of the bottom-gate-type thin-film transistor is arranged to be thinner than that of the lower-side wiring including the gate wiring and the auxiliary capacitor wiring. The thinner the gate electrode is, the less the amount of heat being released via laser-beam irradiation becomes. Because of this, the laser-beam energy can effectively be utilized for crystallization of the semiconductor thin film. On the other hand, inasmuch as sufficient thickness can be provided for the lower-side wiring including the gate wiring and the auxiliary capacitor wiring, the electric resistance can be minimized to make it possible to prevent the time constant from being increased even when the size of the monitor screen becomes larger.

According to the second means of the invention, the lower-side wiring including the gate wiring and the auxiliary capacitor wiring comprises a multi-layered structure in which the second wiring layer having surpassing heat-resistant property is superposed on the first wiring layer having relatively low electric resistance. Width of the second wiring layer (surface layer) is arranged to be wider than that of the first wiring layer (inner layer) to enable the surface layer to fully cover the inner layer. Further, dimension ranging from an end of the inner layer to an end of the surface layer projecting to the outer portion in the width direction is arranged to be greater than the thickness of the surface layer. By forming the stepwise cross-sectional structure by providing the inner-layer below the surface-layer, stepwise difference of the lower-side wiring is reduced to eventually make it possible to prevent inter-layer short-circuit. By suppressing occurrence of such inter-layer short-circuit, production yield can be promoted. Further, by way of utilizing metal material containing low electric resistance for composing the inner layer, increase of electric resistance of the entire lower-side wiring can be suppressed.

DESCRIPTION OF THE PREFERRED EMBODIMENTS

Figure 1A:
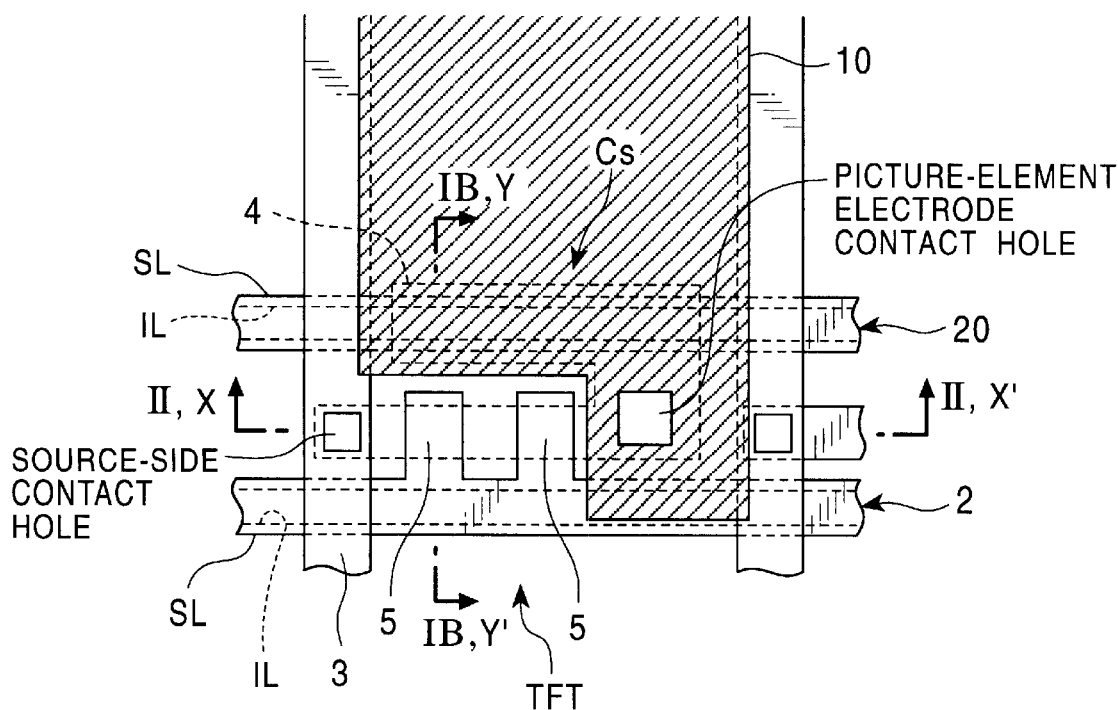
FIG. 1A is a schematic diagram of a thin-film semiconductor apparatus according to one of practical form for carrying out the present invention.
Figure 1B:
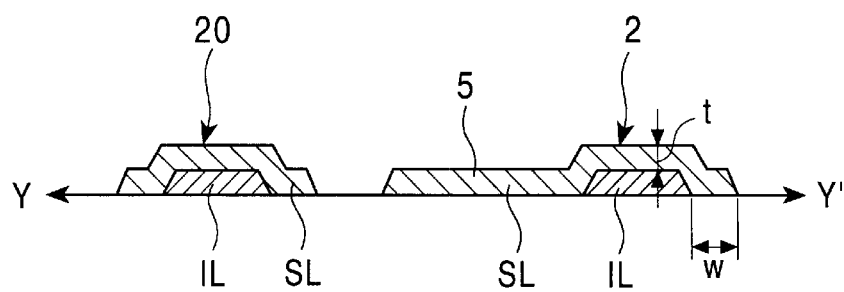
FIG. 1B is a part of a cross-sectional view of the thin-film semiconductor apparatus taken along with a line IB—IB shown in FIG. 1A.

Referring now to the accompanying drawings, practical forms for carrying out the invention are described in detail below. FIGS. 1A and 1B are schematic diagrams designating one of practical forms for embodying a thin-film semiconductor apparatus according to the present invention. The thin-film semiconductor apparatus shown in FIGS. 1A and 1B also comprises a picture element electrode in addition to a bottom-gate-type thin-film transistor. The thin-film semiconductor apparatus shown in FIGS. 1A and 1B is utilized as the drive substrate for driving the so-called active-matrix-type display apparatus. FIG. 1A specifically designates a plan view showing a bottom-gate-type thin-film transistors together with a picture element. As shown here, a thin-film semiconductor apparatus comprises a plurality of bottom-gate-type thin-film transistors TFT integrally formed on an insulating substrate made from glass or the like. Lower-side wirings including a gate wiring 2 and an auxiliary capacitor wiring 20 are formed on a surface of the insulating substrate along with the lateral direction (X–X' direction in FIG. 1A). A gate electrode 5 to be set to the same potential as that of the gate wiring 2 is patterned simultaneously with a patterning process of the gate wiring 2.

In this form of the embodiment, each of the thin-film transistors TFT comprises a double-gate structure whereby a pair of gate electrodes 5 are provided. An insulating film is formed as to fully cover the gate wiring 2, the auxiliary capacitor wiring 20, and two of the gate electrodes 5. In particular, a portion of the insulating film formed on the gate electrodes 5 becomes a gate insulating film.

Further, a semiconductor thin-film 4 for composing device area for the thin-film transistors TFT is formed on the insulating film. In this form of the embodiment, the semiconductor thin-film 4 solely comprises polycrystalline silicon crystallized via a laser-beam irradiation process. A part of this semiconductor thin-film 4 is extended to a portion below the auxiliary capacitor wiring 20 in order to form an auxiliary capacitor Cs.

Upper-side wiring including arrays of signal wiring 3 is formed on the semiconductor thin-film 4 via an inter-layer insulating film. The arrays of the signal wiring 3 are electrically connected to a source area of individual thin-film transistors TFT via source-side contact holes being open to the inter-layer insulating film.

As is clear from the above description, the arrays of the signal wiring 3 are disposed by way of extending themselves in the vertical direction (Y–Y' direction in FIG. 1A), whereas the gate wiring 2 is disposed by way of extending itself in the lateral direction X–X'. Each of the thin-film transistors TFT is formed at the portion at which the signal wiring 3 and the gate wiring 2 intersect to each other. A picture element electrode 10 is formed on the signal wiring 3 via a leveling layer. The picture element electrode 10 is electrically connected to a drain area of the thin-film transistor TFT via a contact hole.

When manufacturing a light transmission-type display apparatus, the picture element electrode 10 comprises a transparent conductive film such as ITO (Indium Tin Oxide), for example. On the other hand, when manufacturing a light reflection-type display apparatus, the picture element electrode 10 comprises metallic material such as aluminum or silver, for example.

FIG. 1B is a part of a cross-sectional view of the thin-film semiconductor apparatus taken along with a line IB—IB shown in FIG. 1A. FIG. 1B specifically shows only the gate electrode 5, the gate wiring 2, and the auxiliary capacitor wiring 20. As is apparent from FIG. 1B, thickness of the gate electrode 5 is arranged to be less than that of the lower-side wiring such as the gate wiring 2 and the auxiliary capacitor wiring 20.

Because of this, amount of heat radiation can be decreased in the course of irradiating the semiconductor thin-film 4 with a laser beam to make it possible to efficiently utilize energy of the emitted laser beam for crystallization of the semiconductor thin-film 4. In this form of the embodiment, both the gate electrode 5 and the gate wiring 2 are constructed to be layered structures, where the number of layers for the gate electrode 5 is less than the number of layers for the lower-side wiring such as the gate wiring 2 and the auxiliary capacitor wiring 20. In this form of the embodiment, the gate electrode 5 comprises a single layer structure consisting of a surface-layer SL, whereas the lower-side wiring such as the gate wiring 2 and the auxiliary capacitor wiring 20 comprises a multi-layered structure having an inner layer IL disposed below the surface layer SL.

More particularly, the inner layer IL is made from such metal having an electric resistance value lower than that of the surface layer SL, whereas the surface layer SL is made from such metal having a specific melting point higher than that of the inner layer IL to protect the inner layer IL. For example, the inner layer IL is made from such metal mainly consisting of aluminum-base material, whereas the surface layer SL is made from such metal selected from molybdenum, tantalum, tungsten, and chromium. The inner layer IL is made from genuine aluminum metal or alloy comprising aluminum added with silicon until fully being saturated. Inasmuch as the above-cited multi-layered structure comprising the inner-layer IL with low electric resistance value and the surface layer SL made from high melting point metal is utilized for composing the gate wiring 2, it is possible to prevent electric resistance of the gate wiring 2 from being raised to properly deal with expansion of the display monitor screen.

Next, another feature of the invention is described below. As described above, the lower-side wiring such as the gate wiring 2 and the auxiliary capacitor wiring 20 comprises the multi-layered structure in which at least the second wiring layer (i.e., the surface layer SL) is superposed on the first wiring layer (i.e., the inner layer IL). Width of the surface layer SL as the second wiring layer is arranged to be wider than that of the inner layer IL as the first wiring layer to enable the surface layer SL to fully cover the inner layer IL. A length of "w" ranging from an end of the inner layer IL to an end of the surface layer SL projecting to the outer portion in the width direction is arranged to be greater than a width "t" of the surface layer SL (w>t). Owing to this arrangement, a cross-sectional view of the gate wiring 2 and the auxiliary capacitor wiring 20 are moderately stepped as shown in FIG. 1B, thus it becomes possible to significantly reduce the stepwise difference between the gate wiring 2 and the auxiliary capacitor wiring 20. As a result, the step coverage of the insulating film is promoted to effectively prevent inter-layer short-circuit between the lower-side wiring and the upper-side wiring from occurrence, thus significantly contributing to the improvement of the production yield rate.

This embodiment specifically sets the target of its application to the thin-film transistor which utilizes polycrystalline silicon crystallized by laser annealing via the laser-beam irradiation process. In addition, any of the previously developed conventional display apparatuses for accommodating a large-size monitor screen integrally forms a number of amorphous silicon thin-film transistors in place of polycrystalline silicon thin-film transistors. Generally, bottom-gate-type structure is also introduced to the conventional amorphous silicon thin-film transistor. Even in this case, along with expansion of the monitor-screen size, it is also necessary to lower the electric resistance of the gate wiring. In such a conventional amorphous silicon thin-film transistor array, the gate wiring is composed of a single-layer solely made from aluminum or alloy comprising aluminum, where the single-layer surface is treated with an anode-oxidation process to suppress generation of "hillock" inherent to aluminum. Alternatively, the second wiring layer comprising high-melting point metal is continuously formed on the first wiring layer comprising aluminum or alloy mainly comprising aluminum before patterning the whole layer en bloc.

However, in this case, the second wiring layer made from high-melt-point metal does not fully cover the aluminum-made first wiring layer, and yet, cross-sectional form itself is not of the stepped configuration. Further, inasmuch as the gate electrode is patterned simultaneously with the patterning of the gate wiring, the layer thickness is equal to each other. Unlike the polycrystalline silicon thin-film, in the case of the conventional amorphous silicon thin-film transistor, crystallization of the semiconductor thin-film is not treated as the prerequisite, and thus, thickness of the gate electrode is arranged to be as thick as that of the gate wiring.

Figure 2:
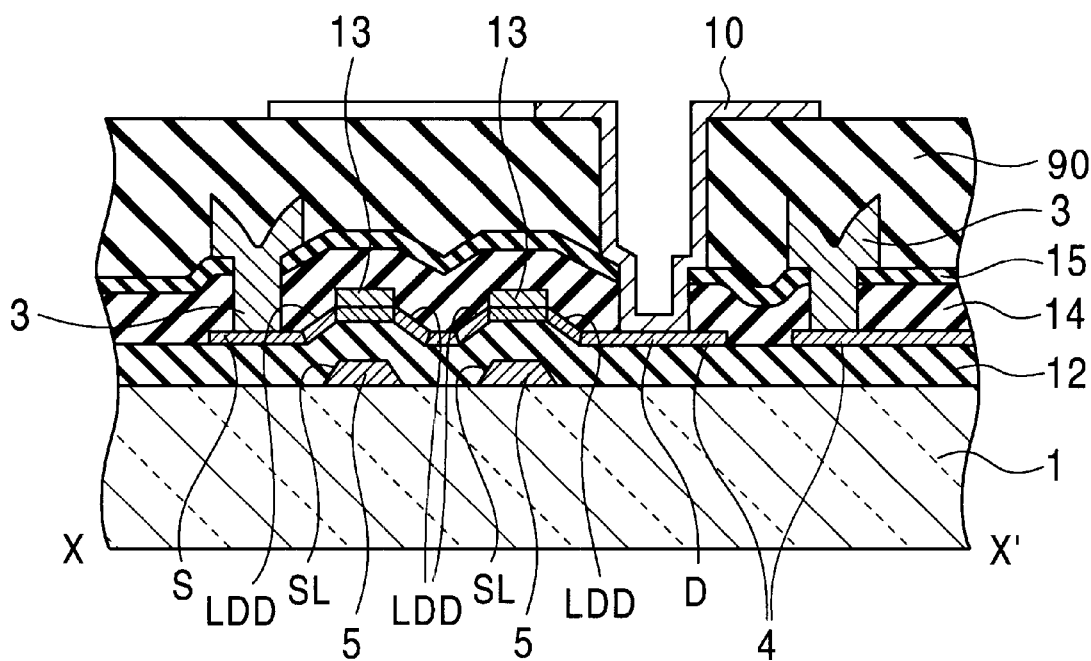
FIG. 2 is a cross-sectional view of the thin-film semiconductor apparatus taken along with a line II—II shown in FIG. 1A.

FIG. 2 is a cross-sectional view of the thin-film semiconductor apparatus taken along with a line X–X' shown in FIG. 1A. Referring to this cross-sectional view, a method of manufacturing the thin-film semiconductor apparatus of this invention is described in detail below.

Initially, a 50 nm thick thin film is formed with aluminum on a transparent insulating substrate made from glass, for example, and this aluminum thin film is patterned into a predetermined form to make up the first wiring layer (the inner layer IL). Next, a 50 nm thick thin film is formed with molybdenum metal by applying a sputtering process, for example, and this molybdenum thin film is patterned into a predetermined form to make up the second wiring layer (the surface layer SL). As being illustrated, the portion corresponding to the gate electrode 5 is solely composed of the surface layer SL comprising a thin-film. Although not shown, the gate wiring and the auxiliary capacitor wiring respectively consist of a multi-layered structure comprising the inner layer IL and the surface layer SL. The multi-layered structure contains such a pattern in which a width of the surface layer SL is arranged to be wider than that of the inner layer IL by approximately 2 μm, for example. A sheet resistance value of the multi-layered structure of the molybdenum thin film having 50 nm of thickness and the aluminum thin film having 50 nm thickness is rated to be approximately 0.7Ω/□. This resistance value is substantially equal to the sheet resistance value of the single-layered wiring comprising a 200 nm thick molybdenum thin film. It is also possible to reduce film thickness by one half while preserving the above sheet resistance value by way of replacing the single-layer molybdenum thin film with a multi-layered structure comprising the molybdenum film and the aluminum film. Further, inasmuch as the 50 nm thick inner layer IL is formed below the 50 nm thick surface layer SL stepwise, it result in the moderated stepwise difference of the lower-side wiring, and yet, it also results in the improved effect of covering the insulating film to totally eliminate the inter-layer short-circuit.

Next, in order to fully cover the gate electrode 5, a gate insulating film 12 is formed by way of depositing $SiO_2$ by 150 nm of thickness by applying a plasma CVD (Chemical Vapor Deposition) method, for example. Next, amorphous silicon is also formed into a 50 nm thick thin film, for example on the gate insulating film 12 via the plasma CVD method. After completing formation of these thin films, the amorphous silicon thin film is annealed at 400° C. for 2 hours, for example, to fully remove hydrogen impregnated in the amorphous silicon.

Next, the annealed silicon thin film is irradiated with an excimer laser beam containing 308 nm of wavelength by applying 400 $mJ/cm^2$ of energy density, thus converting amorphous silicon into polycrystalline silicon and eventually yielding the semiconductor thin-film 4 solely comprising polycrystalline silicon. Next, the semiconductor thin-film 4 is patterned to form a device area of the thin-film transistor TFT and also a device area of the auxiliary capacitor. Inasmuch as the invention provides the gate electrode 5 made from a thin film, unlike the conventional art, it is possible to lower energy density of the laser beam required for crystallizing the amorphous silicon. For example, compared to the case of utilizing such gate electrode 5 comprising a 200 nm thick molybdenum thin-film, result of testing the gate electrode 5 comprising a 50 nm thick molybdenum thin-film evidenced that energy density of the emitted laser beam was successfully lowered by approximately 40 $mJ/cm^2$.

Next, $SiO_2$ material is formed into a 200 nm thick thin-film via the CVD method. Next, by way of applying the gate electrode 5 to serve as a mask, the $SiO_2$ thin film is patterned via a self-alignment process before forming a stopper film 13 in order to cover the portion corresponding to the semiconductor thin-film 4 at the position right above the gate electrode 5. Next, by utilizing the stopper film 13 to serve as the mask, ionized impurities comprising phosphorus are injected into the $SiO_2$ thin film by $1\times10^{13}/cm^2$ of the dose amount, for example, to form a LDD area of the thin-film transistor TFT. Next, after masking the stopper film 13 and periphery of the stopper film 13 with a photo-resist film, ionized impurities comprising phosphorus are injected into the $SiO_2$ thin film by such a dose amount as high as $1\times10^{15}/cm^2$, for example, in order to form a source area S and a drain area D of the thin-film transistor TFT. As a result, an n-channel type thin-film transistor is yielded. In the case of fabricating a p-channel type thin-film transistor, it is suggested that ionized impurities comprising boron in place of phosphorus be injected into the $SiO_2$ thin film by $8\times10^{14}/cm^2$ of the dose amount. Next, impurities injected into the semiconductor thin film 4 is activated by an annealing process utilizing an UV (Ultra Violet) lamp. Next, an interlayer insulating film 14 comprising $SiO_2$ is formed, and then, a passivation film 15 comprising SiN is formed on the inter-layer insulating film 4. Next, contact holes are formed through the inter-layer insulating film 14 and the passivation film 15, and then, the upper-side wiring including the signal wiring 3 made from aluminum, for example, is formed. Next, a leveling insulating layer 90 made from acrylic resin is formed on the upper-side wiring. Next, contact holes are formed through the leveling insulating layer 90, and then, a picture element electrode 10 comprising the transparent conductive film made of the ITO is formed on the leveling insulating film 90 before eventually completing production of the thin-film semiconductor apparatus usable for a drive substrate for driving an active-matrix type display apparatus.

Figure 3A:
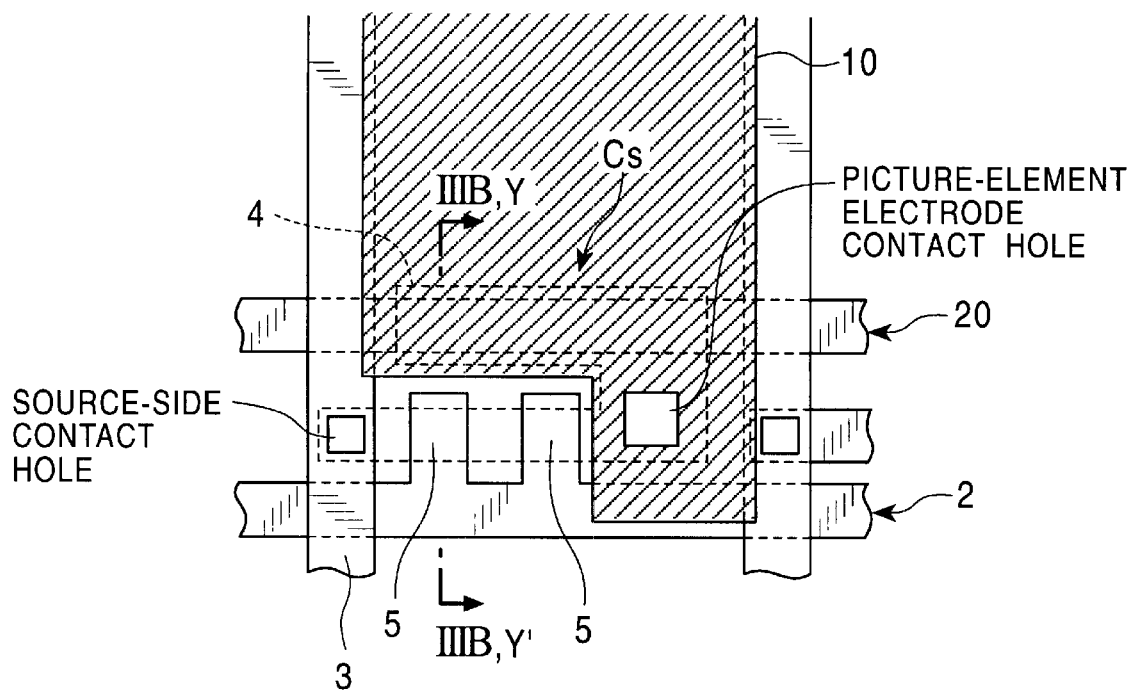
FIG. 3A is a schematic block diagram of a conventional thin-film semiconductor apparatus exemplified as a reference model.
Figure 3B:
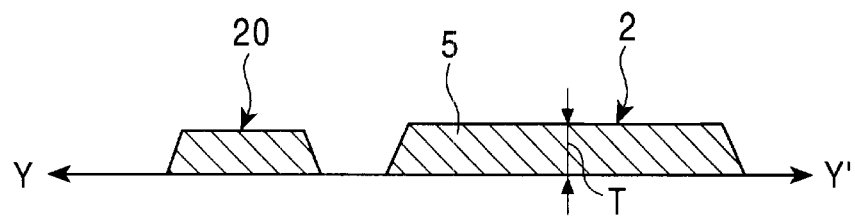
FIG. 3B is a part of a cross-sectional view of the thin-film semiconductor apparatus taken along a line IIIB—IIIB shown in FIG. 3A.

FIGS. 3A and 3B respectively designate a conventional thin-film semiconductor apparatus comprising a single-layered gate wiring 2 and a single-layered auxiliary capacitor wiring 20 as a reference example. FIG. 3A is a plan view corresponding to one picture element. FIG. 3B is a part of a cross-sectional view of the thin-film semiconductor apparatus taken along a line Y–Y' shown in FIG. 3A. To facilitate understanding, those components corresponding to the practical aspect of the invention shown in FIGS. 1A and 1B are respectively designated by the identical reference numerals. As is apparent from FIG. 3A, the gate wiring 2, the auxiliary capacitor wiring 20, and a gate electrode 5, are totally composed of a single-layered structure common to each other. Further, as shown in FIG. 3B, a thickness T is common to the gate wiring 2, the gate electrode 5, and the auxiliary capacitor wiring 20. In this reference example, after a depositing molybdenum metal by 200 nm of thickness, the molybdenum thin film is patterned into the form of the lower-side wiring and the gate electrode.

Figure 4:
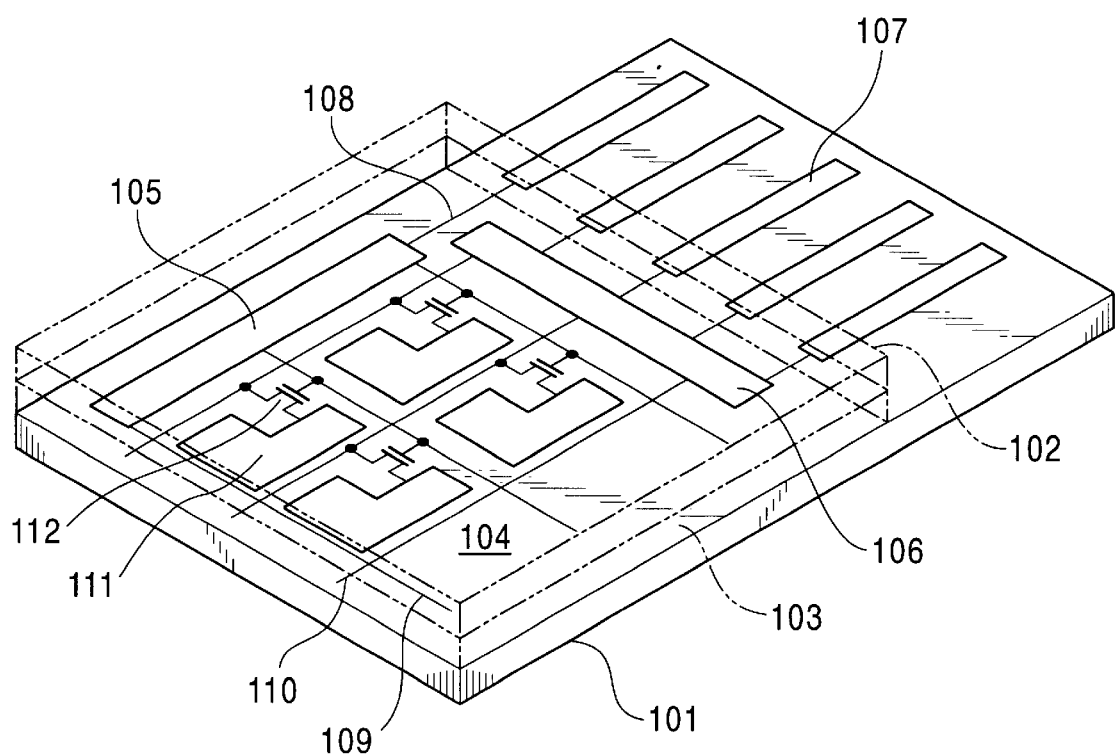
FIG. 4 is a schematic perspective view of an example of the display apparatus according to the invention.

FIG. 4 is a schematic perspective view of an example of an active-matrix type display apparatus integrally being assembled by way of utilizing the thin-film semiconductor apparatus according to the invention. As shown in FIG. 4, the display apparatus comprises a panel-structure incorporating an electro-optical material 103 held between a pair of insulating substrates 101 and 102. TN (Twisted-Nematic) liquid crystal material and a variety of liquid crystal materials are utilized for the electro-optical material 103 widely. A picture element array 104 and drive circuits are integrally assembled on the lower-side insulating substrate 101. The drive circuits composed of thin-film transistors are respectively formed into a vertical drive circuit 105 and a horizontal drive circuit 106. A certain number of externally connecting terminals 107 are disposed at an upper end of the periphery of the lower-side insulating substrate 101. These terminals 107 are individually connected to the vertical drive circuit 105 and the horizontal drive circuit 106 via wiring 108. A plurality of gate wirings 109 aligned in the horizontal direction and a plurality of signal wirings 110 aligned in the vertical direction are formed in the picture element array 104. A plurality of picture element electrodes 111 and a plurality of thin-film transistors 112 for driving these electrodes 111 are formed at the portions at which the gate wirings 109 and the signal wirings 110 intersect to each other.

The gate electrode of the thin-film transistor 112 is disposed by way of extending itself from the corresponding gate wiring 109. A drain area of the transistor 112 is connected to the corresponding picture element electrode 111, whereas the source area is connected to the corresponding signal wiring 110. The gate wiring 109 is connected to the vertical drive circuit 105, whereas the signal wiring 110 is connected to the horizontal drive circuit 106.

It should be noted that the thin-film transistor 112 for driving the picture element electrode 111 via switching operation and the thin-film transistor included in the vertical drive circuit 105 and the horizontal drive circuit 106 have respectively been manufactured in conformity with the invention. Although not being illustrated, opposite electrodes made from ITO, for example, are formed on the inner surface of the upper-side substrate 102.

Figure 5:
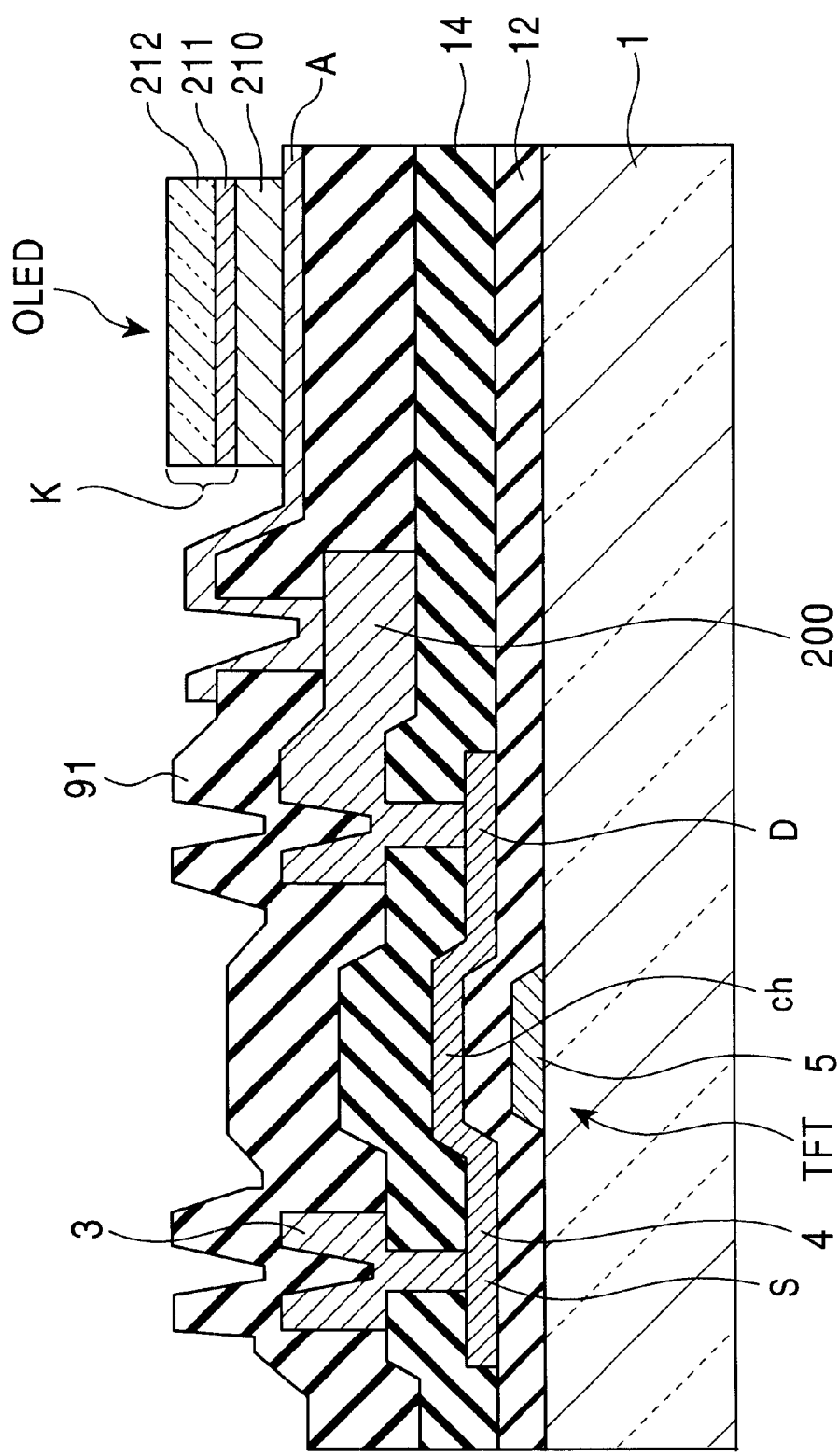
FIG. 5 is a cross-sectional view of another example of the display apparatus according to the invention.

FIG. 5 is a schematic partial cross-sectional view designating another embodiment of a display apparatus according to the invention. In this display apparatus, picture elements are composed of organic electro-luminescence element OLED (Organic Light Emitting Diode), which comprises an anode A, an organic layer 210, and a cathode K serially built up to form a layered structure. The anode A is individually discrete per picture element. Each of the anodes A is composed of chromium, for example, and basically reflects light. On the other hand, the cathode K is individually connected between the picture elements. For example, the cathode K is composed of a layered structure of a metallic layer 211 and a transparent electrically conductive layer 212 and basically being light transmissive. When applying a forward-biased voltage (approximately 10V) between the anode A and the cathode K of the above-referred organic electro-luminescence element OLED comprising the above-specified composition, injection of carrier such as electrons and positive holes occurs to make it possible to observe emission of light. It is conceived that the light-emitting phenomenon generated by the operation of the organic electro-luminescence element OLED is presumably caused by exciting elements formed by the positive holes injected from the anode A and also by the electrons injected from the cathode K.

On the other hand, a thin-film transistor TFT for driving the above-referred organic electro-luminescence element OLED comprises a gate electrode 5 formed via the inventive method on the glass substrate 1, a gate insulating film 12 superposed on an upper surface of the gate electrode 5, and a semiconductor thin-film 4 superposed on an upper portion of the gate electrode 5 via the gate insulating film 12. The semiconductor thin-film 4 comprises a silicon thin film polycrystallized via a laser beam applied by an annealing process, for example. The thin-film transistor TFT contains a source area S allowing passage of current being fed to the organic electro-luminescence element OLED, a channel area ch, and a drain area D. The thin-film transistor TFT comprising the bottom-gate structure is fully covered by an inter-layer insulating film 14. Signal wiring 3 and a drain electrode 200 are respectively formed on the inter-layer insulating film 14. The above-referred organic electro-luminescence element OLED is formed on the signal wiring 3 and the drain electrode 200 via the other inter-layer insulating film 91. The anode A of the organic electro-luminescence element OLED is electrically connected to the thin-film transistor TFT via the drain electrode 200.

As is clear from the above description, according to the first aspect of the invention, in the thin-film transistor having a bottom-gate structure, thickness of the gate electrode is arranged to be thinner than that of the gate wiring. Because of this arrangement, when crystallizing a semiconductor thin film via a laser beam by a laser annealing process, it is possible to efficiently utilize energy emitted from the laser beam without being dissipated on the part of the gate electrode. On the other hand, inasmuch as the gate wiring can secure sufficient thickness as of the state in which thickness of the gate electrode remains being thin, it is possible to lower an electric resistance, thus properly dealing with a large-size display apparatus as well.

According to the second aspect of the invention, the gate wiring comprises a multi-layered structure in which an inner layer is formed below the surface layer. The width of the surface layer is arranged to be wider than that of the inner layer to enable the surface layer to fully cover the inner layer, and yet, dimension ranging from an end of the inner layer to an end of the surface layer projecting to the outer portion in the width direction is arranged to be greater than the thickness of the surface layer. By virtue of introducing the above-referred multi-layered structure, unlike the conventional single-layered structure, it is possible to thin off the film thickness without causing the electric resistance to be increased. In addition, since the cross-sectional configuration is formed to be a moderated stepwise, the inter-layer short-circuit can hardly be generated, thus leading to the promoted production yield.

What is claimed is:

1. A thin-film semiconductor apparatus having a thin-film transistor formed on an insulating substrate comprising:
   a lower-side wiring formed on said substrate;
   a gate electrode to be set to the same potential with said lower-side wiring and patterned simultaneously with patterning of said lower-side wiring;
   an insulating film formed on said lower-side wiring and said gate electrode;
   a semiconductor thin-film formed on said insulating film as to form a device area of said thin-film transistor;
   an inter-layer film formed on said semiconductor thin-film; and an upper-side wiring formed on said inter-layer film and connected to said thin-film transistor via a contact hole; wherein said gate electrode has a thickness less than that of said lower-side wiring.

2. The thin-film semiconductor apparatus according to claim 1, wherein said gate electrode and said lower-side wiring respectively comprises a layered-structure, wherein the number of layers for said gate electrode is less than the number of layers for said lower-side wiring.

3. The thin-film semiconductor apparatus according to claim 2, wherein said gate electrode comprises a single-layered structure solely comprising a surface layer, whereas said lower-side wiring comprises a multi-layered structure comprising an inner-layer formed below said surface layer.

4. The thin-film semiconductor apparatus according to claim 3, wherein said inner layer comprises a metal layer having an electric resistance being lower than that of said surface layer; wherein said surface layer comprises a metal film having a melting point being higher than that of said inner layer.

5. The thin-film semiconductor apparatus according to claim 4, wherein said inner layer comprises a metal layer mainly comprising aluminum, and said surface layer comprises any metal layer selected from molybdenum, tantalum, tungsten, and chromium.

6. The thin-film semiconductor apparatus according to claim 1, wherein said semiconductor thin-film comprises polycrystalline silicon crystallized by a laser-beam irradiation process.

7. A thin-film semiconductor apparatus having a plurality of thin-film transistors integrated on an insulating substrate comprising:

a lower-side wiring formed on said substrate;

a gate electrode connected to said lower-side wiring;

an insulating film formed on said lower-side wiring and said gate electrode;

a semiconductor thin film formed on said insulating film as to form device areas of said thin-film transistors;

an inter-layer film formed on said semiconductor thin-film; and an upper-side wiring formed on said inter-layer film and connected to said thin-film transistors via contact holes; wherein said lower-side wiring comprises a multi-layered structure in which at least a second wiring layer is superposed on a first wiring layer;

said second wiring layer has such a width dimension being greater than that of said first wiring layer as to fully cover the said first wiring layer; and a dimension ranging from an end of said first wiring layer to an end of said second wiring layer projecting to external portion in the width direction is greater than thickness of said second wiring layer.

8. The thin-film semiconductor apparatus according to claim 7, wherein said first wiring layer comprises such metal layer having an electric resistance being lower than that of said second wiring layer, and said second wiring layer comprises such metal layer having a melting point being higher than that of said first wiring layer.

9. The thin-film semiconductor apparatus according to claim 8, wherein said first wiring layer comprises such metal layer mainly comprising aluminum;

and said second wiring layer comprises any metal layer selected from molybdenum, tantalum, tungsten, and chromium.

10. The thin-film semiconductor apparatus according to claim 7, wherein said lower-side wiring comprises a multi-layered structure in which at least said second wiring layer is superposed on said first wiring layer, and said gate electrode comprises a single-layered structure solely comprising said second wiring layer.

11. The thin-film semiconductor apparatus according to claim 7, wherein said semiconductor thin film comprises polycrystalline silicon crystallized by a laser-beam irradiation process.

12. A display apparatus having a plurality of picture elements being arrayed via matrix formation and a plurality of thin-film transistors for driving said picture elements integrated on an insulating substrate comprising:

a lower-side wiring formed on said substrate;

a gate electrode to be set to the same potential with that of said lower-side wiring and patterned simultaneously with patterning of said lower-side wiring;

an insulating film formed on said lower-side wiring and said gate electrode;

a semiconductor thin film formed on said insulating film as to form a device area of the thin-film transistor;

an inter-layer film formed on said semiconductor thin film; and an upper-side wiring formed on said inter-layer film and connected to the thin-film transistor via a contact hole; wherein said gate electrode has such a thickness being less than that of said lower-side wiring.

13. The display apparatus according to claim 12, wherein said gate electrode and said lower-side wiring individually comprises a layered-structure; and the number of layers for said gate electrode is less than the number of layers for said-lower-side wiring.

14. The display apparatus according to claim 13, wherein said gate electrode comprises a single-layered structure solely comprising a surface layer; and said lower-side wiring comprises a multi-layered structure in which an inner layer is formed below said surface layer.

15. The display apparatus according to claim 14, wherein said inner layer is composed of such metal layer having an electric resistance being lower than that of said surface layer; and said surface layer is composed of such metal layer having melting point being higher than that of said inner layer.

16. The display apparatus according to claim 15, wherein said inner layer is composed of such metal layer mainly comprising aluminum, and said surface layer is composed of any metal layer selected from molybdenum, tantalum, tungsten, and chromium.

17. The display apparatus according to claim 12, wherein said semiconductor thin film comprises polycrystalline silicon crystallized via a laser-beam irradiation process.

18. The display apparatus according to claim 17, further comprising:

a plurality of thin-film transistors made of polycrystalline silicon integrally formed on the insulating substrate as to form peripheral circuits.

19. A display apparatus having a plurality of picture elements being arrayed via matrix formation and a plurality of thin-film transistors for driving said picture elements integrated on an insulating substrate comprising:

a lower-side wiring formed on said substrate;

a gate electrode connected to said lower-side wiring;

an insulating film formed on said lower-side wiring and said gate electrode;

a semiconductor thin film formed on said insulating film as to form a device area of the thin-film transistor;

an inter-layer film formed on said semiconductor thin film; and an upper-side wiring formed on said inter-layer film and connected to the thin-film transistor via a contact hole; wherein said lower-side wiring comprises a multi-layered structure in which at least a second wiring layer is superposed on a first wiring layer;

said second wiring layer has such a width dimension being greater than that of said first wiring layer as to fully cover the said first wiring layer; and a dimension ranging from an end of said first wiring layer to an end of said second wiring layer projecting to external portion in the width direction is greater than thickness of said second wiring layer.

20. The display apparatus according to claim 19, wherein said first wiring layer comprises such metal layer having an electric resistance being lower than that of said second wiring layer, and said second wiring layer comprises such metal layer having a melting point being higher than that of said first wiring layer.

21. The display apparatus according to claim 20, wherein said first wiring layer comprises such metal layer mainly comprising aluminum; and said second wiring layer comprises any metal layer selected from molybdenum, tantalum, tungsten, and chromium.

22. The display apparatus according to claim 19, wherein said lower-side wiring comprises a multi-layered structure in which at least said second wiring layer is superposed on said first wiring layer, and said gate electrode comprises a single-layered structure solely comprising said second wiring layer.

23. The display apparatus according to claim 19, wherein said semiconductor thin film comprises polycrystalline silicon crystallized by a laser-beam irradiation process.

24. The display apparatus according to claim 23, further comprising:

a plurality of thin-film transistors made of polycrystalline silicon integrally formed on the insulating substrate as to form peripheral circuits.

25. A method of manufacturing a display apparatus having a plurality of picture elements being arrayed via matrix formation and a plurality of thin-film transistors for driving said picture elements integrated on an insulating substrate, said method comprising serial manufacturing steps of;

a step of forming a lower-side wiring to be disposed on said substrate;

a step of forming a gate electrode to be set to the same potential with that of said lower-side wiring and patterned simultaneously with patterning of said lower-side wiring;

a step of forming an insulating film over said lower-side wiring and said gate electrode;

a step of forming semiconductor thin film which is disposed on said insulating film as to make a device area of thin-film transistor;

a step of forming an inter-layer film on said semiconductor thin film; and a step of forming an upper-side wiring which is disposed on said inter-layer film and connected to thin-film transistor via a contact hole; wherein a thickness of said gate electrode is set to be less than that of said lower-side wiring layer in said gate electrode forming step.

26. The method of manufacturing the display apparatus according to claim 25, wherein said gate electrode and said lower-side wiring individually comprises a layered-structure; and the number of layers for said gate electrode is less than the number of layers for said-lower-side wiring.

27. The method of manufacturing the display apparatus according to claim 26, wherein said gate electrode comprises a single-layered structure solely comprising a surface layer; and said lower-side wiring comprises a multi-layered structure in which an inner layer is formed below said surface layer.

28. The method of manufacturing the display apparatus according to claim 27, wherein said inner layer is composed of such metal layer having an electric resistance being lower than that of said surface layer; and said surface layer is composed of such metal layer having melting point being higher than that of said inner layer.

29. The method of manufacturing the display apparatus according to claim 28, wherein said inner layer is composed of such metal layer mainly comprising aluminum, and said surface layer is composed of any metal layer selected from molybdenum, tantalum, tungsten, and chromium.

30. The method of manufacturing the display apparatus according to claim 25, wherein said semiconductor thin film comprises polycrystalline silicon crystallized via a laser-beam irradiation process.

31. The method of manufacturing the display apparatus according to claim 30, further comprising:

a step of forming a plurality of thin-film transistors made of polycrystalline silicon integrally on the insulating substrate as to form peripheral circuits.

32. A method of manufacturing a display apparatus having a plurality of picture elements being arrayed via matrix formation and a plurality of thin-film transistors for driving said picture elements integrated on an insulating substrate; said method comprising serial manufacturing steps of:

a step of forming a lower-side wiring on said substrate;

a step of connecting a gate electrode connected to said lower-side wiring;

a step of forming an insulating film on said lower-side wiring and said gate electrode;

a step of forming a semiconductor thin film on said insulating film as to form a device area of the thin-film transistor;

a step of forming an inter-layer film on said semiconductor thin film; and a step of forming an upper-side wiring on said interlayer film and connecting to the thin-film transistor via a contact hole; wherein said lower-side wiring is formed in a multi-layered structure in which at least a second wiring layer is superposed on a first wiring layer;

width dimension of said second wiring layer is arranged to be greater than the width dimension of said first wiring layer as to fully cover said first wiring layer; and dimension ranging from an end of said first wiring layer to an end of said second wiring layer projecting to external portion in the width direction is arranged to be greater than thickness dimension of said second wiring layer.

33. The method of manufacturing the display apparatus according to claim 32, wherein said first wiring layer comprises such metal layer having an electric resistance being lower than that of said second wiring layer, and said second wiring layer comprises such metal layer having melting point being higher than that of said first wiring layer.

34. The method of manufacturing the display apparatus according to claim 33, wherein said first wiring layer comprises such metal layer mainly comprising aluminum; and said second wiring layer comprises any metal layer selected from molybdenum, tantalum, tungsten, and chromium.

35. The method of manufacturing the display apparatus according to claim 32, wherein said lower-side wiring comprises a multi-layered structure in which at least said second wiring layer is superposed on said first wiring layer, and said gate electrode comprises a single-layered structure solely comprising said second wiring layer.

36. The method of manufacturing the display apparatus according to claim 32, wherein said semiconductor thin film comprises polycrystalline silicon crystallized by a laser-beam irradiation process.

37. The method of manufacturing the display apparatus according to claim 36, further comprising:

a step of forming a plurality of thin-film transistors made of polycrystalline silicon integrally on the insulating substrate as to form peripheral circuits.

* * * * *